United States Patent
Nakata et al.

(10) Patent No.: US 10,825,751 B2
(45) Date of Patent: Nov. 3, 2020

(54) SEMICONDUCTOR DEVICE

(71) Applicant: Mitsubishi Electric Corporation, Tokyo (JP)

(72) Inventors: Yosuke Nakata, Tokyo (JP); Tatsuya Kawase, Tokyo (JP); Mikio Ishihara, Tokyo (JP); Noboru Miyamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/080,029

(22) PCT Filed: Apr. 1, 2016

(86) PCT No.: PCT/JP2016/060953
§ 371 (c)(1),
(2) Date: Aug. 27, 2018

(87) PCT Pub. No.: WO2017/168756
PCT Pub. Date: Oct. 5, 2017

(65) Prior Publication Data
US 2019/0067159 A1 Feb. 28, 2019

(51) Int. Cl.
*H01L 23/10* (2006.01)
*H01L 23/373* (2006.01)
(Continued)

(52) U.S. Cl.
CPC .......... *H01L 23/373* (2013.01); *H01L 23/367* (2013.01); *H01L 23/3735* (2013.01);
(Continued)

(58) Field of Classification Search
CPC . H01L 23/373; H01L 23/3735; H01L 23/367; H01L 23/4334; H01L 25/072; H01L 2224/04042
(Continued)

(56) References Cited

U.S. PATENT DOCUMENTS 8,810,026 B2 * 8/2014 Kadoguchi ............. H01L 23/36
257/712
8,890,310 B2 * 11/2014 Lee ..................... H01L 23/4334
257/666
(Continued)

FOREIGN PATENT DOCUMENTS

JP 2003-258166 A 9/2003
JP 2004-311685 A 11/2004
(Continued)

OTHER PUBLICATIONS

International Search Report issued in PCT/JP2016/060953; dated May 17, 2016.
(Continued)

*Primary Examiner* — Nitin Parekh
(74) *Attorney, Agent, or Firm* — Studebaker & Brackett PC

(57) ABSTRACT

In semiconductor device, a substrate unit includes an insulating substrate, a first conductor substrate and a second conductor substrate which are disposed on one main surface of the insulating substrate and spaced apart from each other, and a third conductor substrate which is disposed on the other main surface opposite to the one main surface of the insulating substrate. A terminal is connected to a surface of a semiconductor element opposite to the first conductor substrate. The terminal extends from a region above the semiconductor element to a region above the second conductor substrate while being connected to the second conductor substrate. At least a part of the terminal, the substrate unit and the semiconductor element is sealed by a resin. The third conductor substrate is exposed from the resin.

14 Claims, 5 Drawing Sheets

(51) Int. Cl.
  *H01L 25/18* (2006.01)
  *H01L 25/07* (2006.01)
  *H01L 23/433* (2006.01)
  *H01L 23/367* (2006.01)
  *H01L 23/00* (2006.01)

(52) U.S. Cl.
  CPC .......... *H01L 23/4334* (2013.01); *H01L 24/32* (2013.01); *H01L 25/072* (2013.01); *H01L 25/18* (2013.01); *H01L 2224/04042* (2013.01); *H01L 2224/32225* (2013.01); *H01L 2224/40* (2013.01); *H01L 2224/48229* (2013.01); *H01L 2224/48247* (2013.01); *H01L 2224/73265* (2013.01); *H01L 2924/10272* (2013.01); *H01L 2924/13055* (2013.01); *H01L 2924/13091* (2013.01); *H01L 2924/181* (2013.01)

(58) Field of Classification Search
  USPC .................................................. 257/706, 675
  See application file for complete search history.

(56) References Cited

U.S. PATENT DOCUMENTS

| | | | |
|---|---|---|---|
| 2003/0122232 A1 | 7/2003 | Hirano et al. | |
| 2004/0080028 A1* | 4/2004 | Yanagisawa | H01L 24/37 257/675 |
| 2005/0017290 A1 | 1/2005 | Takahashi et al. | |
| 2006/0192291 A1 | 8/2006 | Yokozuka | |
| 2007/0138624 A1* | 6/2007 | Sudo | H01L 23/3121 257/706 |
| 2008/0258172 A1 | 10/2008 | Takahashi et al. | |
| 2010/0133670 A1* | 6/2010 | Liu | H01L 24/36 257/675 |
| 2010/0164078 A1* | 7/2010 | Madrid | H01L 23/3107 257/675 |
| 2010/0176498 A1* | 7/2010 | Lee | H01L 25/162 257/675 |
| 2013/0062745 A1* | 3/2013 | Kimura | H01L 23/4334 257/675 |
| 2017/0092596 A1 | 3/2017 | Yoshihara | |
| 2017/0338190 A1* | 11/2017 | Fujino | H01L 23/051 |

FOREIGN PATENT DOCUMENTS

| | | |
|---|---|---|
| JP | 2005-057235 A | 3/2005 |
| JP | 2006-237419 A | 9/2006 |
| JP | 2009-124082 A | 6/2009 |
| JP | 2012-043875 A | 3/2012 |
| JP | 2014-150203 A | 8/2014 |
| JP | 2015-115471 A | 6/2015 |
| JP | 2016-004796 A | 1/2016 |

OTHER PUBLICATIONS

An Office Action; "Notice of Reasons for Refusal," dated by the Japanese Patent Office on Jun. 4, 2019, which corresponds to Japanese Patent Application No. 2018-508340 and is related to U.S. Appl. No. 16/080,029; with English language translation.

An Office Action; "Notification of Reasons for Refusal," dated by the Japanese Patent Office on Jan. 7, 2020, which corresponds to Japanese Patent Application No. 2018-508340 and is related to U.S. Appl. No. 16/080,029; with English language translation.

* cited by examiner

SEMICONDUCTOR DEVICE

TECHNICAL FIELD

The present invention relates to a semiconductor device, and more particularly to a power semiconductor device for improving cooling efficiency.

BACKGROUND ART

Japanese Patent Laying-Open No. 2015-115471 (PTD 1) discloses a mechanism which is disposed in a semiconductor device mounted with a power semiconductor element such as IGBT (Insulated Gate Bipolar Transistor) and configured to dissipate heat generated by the power semiconductor element from one surface such as the lowest surface of the semiconductor device. In addition, Japanese Patent Laying-Open No. 2003-258166 (PTD 2) discloses another power semiconductor device with improved heat dissipation. In each of the semiconductor devices, a cooler such as a heat sink is bonded to the lower surface of the semiconductor device so as to dissipate heat therefrom.

CITATION LIST

Patent Documents

PTD 1: Japanese Patent Laying-Open No. 2015-115471
PTD 2: Japanese Patent Laying-Open No. 2003-258166

SUMMARY OF INVENTION

Technical Problem

In general, the heat transmitted to the upper surface of the semiconductor element is more difficult to be dissipated to the outside than the heat transmitted to the lower surface thereof, and thus it is desired to efficiently dissipate the heat transmitted to the upper surface of the semiconductor element. Japanese Patent Laying-Open No. 2015-115471 discloses two power semiconductor elements, each of which generates a large amount of heat, and a top surface thereof is connected to a metal plate. According to Japanese Patent Laying-Open No. 2015-115471, the metal plate connected to the top surface of each semiconductor element disclosed is configured to receive the large amount of heat generated by each power semiconductor element. Generally, a semiconductor element has a larger thermal resistance than a conductor material or the like. Therefore, it is considered that it is not sufficient to dissipate the heat to the outside of the device through the metal plate due to its heat capacity. In other words, it is considered that the overall heat dissipation of the semiconductor device disclosed in Japanese Patent Laying-Open No. 2015-115471 is not sufficient.

On the other hand, Japanese Patent Laying-Open No. 2003-258166 discloses such a semiconductor element that a metal body is bonded to the upper surface and the lower surface of the semiconductor element, respectively, and both the metal body bonded to the upper surface and the metal body bonded to the lower surface are exposed from the resin material on the lower surface of the semiconductor device. Thus, the heat transmitted to the upper surface of the semiconductor element may be dissipated in the same way as the heat transmitted to the lower surface of the semiconductor element via a cooler or the like connected to the lower surface of the semiconductor device in higher efficiency.

However, in Japanese Patent Laying-Open No. 2003-258166, it is necessary to dispose an insulating sheet or the like so as to electrically insulate the first metal body which is bonded to the lower surface of the semiconductor element and exposed from the resin material on the lower surface of the semiconductor device from the second metal body which is bonded to the upper surface of the semiconductor element and exposed from the resin material on the lower surface of the semiconductor device. Due to the presence of the insulating sheet, it is difficult to ensure the positional accuracy in connecting the cooler to the lower surface of the semiconductor device. Moreover, it is required to ensure the degree of parallelism between the first metal body exposed from the resin material and the second metal body exposed from the resin material on the lower surface of the semiconductor device, however, when both the first metal body and the second metal body are disposed on the same plane, it is difficult to ensure the degree of parallelism of the entire semiconductor device. For example, if the degree of parallelism between the two metal bodies is not ensured, a gap may be formed between the second metal body and the heat sink, which lowers the heat dissipation from the second metal body, making it difficult to ensure the insulation between the first metal body and second metal body.

The present invention has been accomplished in view of the aforementioned problems, and it is therefore an object of the present invention to provide a semiconductor device which is capable of achieving uniform heat dissipation and easily attachable to a cooler.

Solution to Problem

The semiconductor device according to the present invention includes a substrate unit, a semiconductor element, and a terminal. The substrate unit includes an insulating substrate, a first conductor substrate and a second conductor substrate which are disposed on one main surface of the insulating substrate and spaced apart from each other, and a third conductor substrate which is disposed on the other main surface opposite to the one main surface of the insulating substrate. The semiconductor element is connected to a surface of the first conductor substrate opposite to the insulating substrate. The terminal is connected to a surface of the semiconductor element opposite to the first conductor substrate. The terminal extends from a region above the semiconductor element to a region above the second conductor substrate, and is connected to the second conductor substrate. At least a part of the substrate unit, the semiconductor element and the terminal is sealed by resin. The third conductor substrate is exposed from the resin.

Advantageous Effects of Invention

According to the present invention, since the terminal connected to the semiconductor element by extending from the upper surface side of the semiconductor element to the second conductor substrate disposed on the lower surface side of the semiconductor element, it is possible to improve heat dissipation from the upper surface side to the lower surface side of the semiconductor element. The disposition of the third conductor substrate on the other main surface of the substrate improves the flatness of the entire semiconductor device, making it easy to connect the cooler to the lower surface of the semiconductor device.

DESCRIPTION OF EMBODIMENTS

Hereinafter, embodiments will be described with reference to the drawings.

First Embodiment

Figure 1:
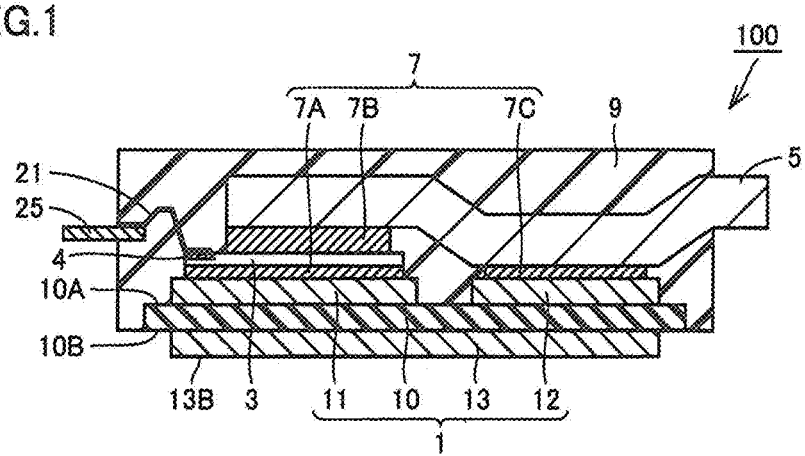
FIG. 1 is a schematic cross-sectional view illustrating the configuration of a featured part of a semiconductor device according to a first embodiment.

First, the configuration of a semiconductor device according to the present embodiment will be described with reference to FIGS. 1 and 2. FIG. 1 is a cross-sectional view schematically illustrating a part taken along line I-I in FIG. 2. The semiconductor device 100 according to the present embodiment mainly includes a substrate unit 1, a semiconductor element 3, a terminal 5, a connecting material 7, and a resin 9. The connecting material 7 includes connecting materials 7A, 7B and 7C.

The substrate unit 1 includes an insulating substrate 10, a first conductor substrate 11, a second conductor substrate 12, and a third conductor substrate 13. The insulating substrate 10 is a tabular member made of aluminum nitride, and has a rectangular shape in plan view, for example. The insulating substrate 10 includes one main surface 10A on the upper side in FIG. 1, and the other main surface 10B on the opposite side to one main surface 10A, in other words, on the lower side in FIG. 1. The first conductor substrate 11 and the second conductor substrate 12 are tabular members disposed on one main surface 10A of the insulating substrate 10.

The first conductor substrate 11 and the second conductor substrate 12 are disposed on one main surface 10A and spaced apart from each other. The third conductor substrate 13 is disposed on the other main surface 10B of the insulating substrate 10. The third conductor substrate 13 is a tabular member having a rectangular shape in plan view, for example. It is preferable that the third conductor substrate 13 is arranged to cover a region on the other main surface 10B which is sufficiently wide so as to include at least the regions overlapped with the first conductor substrate 11 and the second conductor substrate 12 in plan view, and more preferable to cover the entire area of the other main surface 10B. It is preferable that the first conductor substrate 11, the second conductor substrate 12 and the third conductor substrate 13 each is made of copper, for example, and is connected directly to one main surface 10A or to the other main surface 10B.

The semiconductor element 3 is a chip-like member mounted with a power semiconductor device such as an IGBT, a MOSFET (Metal Oxide semiconductor Field Effect Transistor) or a diode. It is preferable that the chip-like member serving as the main body of the semiconductor element 3 is a wide band gap semiconductor element, and it is preferable that the semiconductor element 3 is made of, for example, a compound such as silicon carbide (SiC) containing silicon and carbon as the primary component. Thereby, it is possible to reduce the dimension of the semiconductor element 3. The semiconductor element 3 is connected to a surface of the first conductor substrate 11 opposite to the insulating substrate 10, in other words, the upper surface in FIG. 1 via the connecting material 7A such as solder.

The upper surface of the semiconductor element 3 as illustrated in FIG. 1 and the lower surface of the semiconductor element 3 as illustrated in FIG. 1 each is provided with an electrode (not shown) made of, for example, an aluminum thin film and a solder-bonding metal film (not shown) made of nickel. In the present embodiment, the solder-bonding metal film is formed on the outside of the electrode in plan view prior to the application of the connecting material 7A such as solder so as to protect the metal film from the connecting material 7A. The electrode made of an aluminum thin film may be used as, for example, a control electrode 4 to be described later.

The terminal 5 is connected to a surface of the semiconductor element 3 opposite to the first conductor substrate 11, in other words, the upper surface in FIG. 1 via the connecting material 7B such as solder. The terminal 5 extends from a region above the semiconductor element 3 to a region above the second conductor substrate 12, and is connected to the second conductor substrate 12. In other words, the terminal 5 is bonded to the upper surface of the semiconductor element 3 via the connecting material 7B, and is bonded to the upper surface of the second conductor substrate 12 via the connecting material 7C such as solder.

Thus, the terminal 5 is directly connected to the second conductor substrate 12. In the present specification, direct connection means that except a connecting material such as solder for connecting the terminal 5 and the second conductor substrate 12, no any other member (for example, an insulating sheet) is present therebetween. In other words, the semiconductor element 3 is not connected to the upper surface of the second conductor substrate 12 in FIG. 1. The terminal 5 is connected to the single semiconductor element 3 only.

In FIG. 1, the thickness of the connecting material 7A in the vertical direction is preferably 50 μm or more and 200 μm or less, the thickness of the connecting material 7B in the vertical direction is preferably 50 μm or more and 300 μm or less, and the thickness of the connecting material 7C in the vertical direction is preferably 50 μm or more and 200 μm or less. The connecting material 7 is provided with a thickness of 50 μm or more, which makes it possible to buffer a stress generated in a contacting area between the semiconductor element 3 and the first conductor substrate 11 or between the semiconductor element 3 and the terminal 5 or between the terminal 5 and the second conductor substrate 12 by the difference between the linear expansion coefficients of contacting members. The connecting material 7A disposed underneath the semiconductor element 3 is provided with a thickness of 200 μm or less, which makes it possible to prevent the thermal resistance of the connecting material 7A from decreasing and prevent the semiconductor element 3 mounted thereon from inclining. The upper limit of the thickness of the connecting materials 7B and 7C is set to 300 μm or less, which makes it possible to absorb the tolerance of parallelism of the terminal 5 and prevent the thermal resistance of the connecting materials 7B and 7C from decreasing.

The first terminal surface of the terminal 5 on the same side as the substrate unit 1, in other words, the lower surface of the terminal 5 in FIG. 1, has a shorter distance to the substrate unit 1 from a part located right above the second conductor substrate 12 than another part located right above the first conductor substrate 11. In other words, the terminal 5 is bent so as to extend downward in FIG. 1 between a region right above the first conductor substrate 11 and a region right above the second conductor substrate 12. When the thickness of the connecting material 7A and the thickness of the connecting material 7C in FIG. 1 are substantially equal to each other, the part of the terminal 5 right above the second conductor substrate 12 is disposed lower than another part of the terminal 5 right above the first conductor substrate 11 by the sum of the thickness of the semiconductor element 3 and the thickness of the connecting material 7B in the vertical direction of FIG. 1.

For example, in plan view, the terminal 5 is a rectangular plate conductor extending in a direction from the first conductor substrate 11 to the second conductor substrate 12. The terminal 5 is made of a conductor material such as copper, and has a thickness of 0.3 mm or more and 2.0 mm or less. It is preferable that the terminal 5 has a larger heat capacity than the first conductor substrate 11.

In the semiconductor device 100, at least a part of the substrate unit 1, the semiconductor element 3 and the terminal 5 mentioned above is sealed by a resin 9. Specifically, in FIG. 1, the surface of the first conductor substrate 11 and the second conductor substrate 12 which are disposed on one main surface 10A of the insulating substrate 10 of the substrate unit 1, except the region connected by the other members is covered and sealed by the resin 9. The surface of the semiconductor element 3 is also covered with the resin 9 except those regions to be bonded by the connecting materials 7A and 7B. The terminal 5 is exposed from the resin 9 in a region right to the right end of the substrate unit 1 in FIG. 1, and the other part thereof is covered with the resin 9 except those regions to be bonded by the connecting materials 7B and 7C. In particular, a second terminal surface of the terminal 5 opposite to the substrate unit 1, in other words, the upper surface of the terminal 5 in FIG. 1 is covered with the resin 9 at least at a part right above the first conductor substrate 11 and another part right above the second conductor substrate 12. Therefore, except the part protruding to the outside from the right end of the resin 9 in FIG. 1, the second terminal surface of the terminal 5 is entirely covered with the resin 9 without being exposed from the uppermost surface of the resin 9. The resin 9 is, for example, a generally known epoxy resin material.

However, the third conductor substrate 13 is not sealed by the resin 9, and thereby is exposed from the resin 9. A main surface 13B on the lower side of the third conductor substrate 13 in FIG. 1 is exposed from the resin 9 except the region to be bonded to the other main surface 10B of the insulating substrate 10.

By sealing at least a part of the substrate unit 1, semiconductor element 3, the first conductor substrate 11, the second conductor substrate 12 and the terminal 5 with the resin 9, it is possible to ensure the electric insulation between each of the members and the outside of the semiconductor device 100. Moreover, owing to the resin 9, it is possible to prevent the semiconductor element 3 from being short-circuited with the other members by disturbance factors such as foreign matters and humidity. Consequently, the handling property and reliability of the semiconductor device 100 may be improved.

Although not shown in the drawings, the main surface 13B on the lower side of the semiconductor device 100 illustrated in FIG. 1, in other words, the lower main surface of the third conductor substrate 13 is connected to a cooler such as a heat sink by using a bonding agent such as grease which is different from the connecting material 7.

The semiconductor element 3 is provided with, for example, a plurality of control electrodes 4 on its upper surface. Each control electrode 4 is electrically connected to an external electrode 25 via a wire 21 made of aluminum, for example. The external electrode 25 is such an electrode that electrically connects the inside and the outside of the resin 9, in other words, electrically connects the inside and the outside of the semiconductor device 100, and extends from the inside to the outside of the resin 9. Thus, an electric signal may be input to the semiconductor element 3 through the external electrode 25 and the wire 21 from the outside of the semiconductor device 100. Thus, it is possible to actuate the semiconductor element 3 from the outside of the semiconductor device 100.

Figure 2:
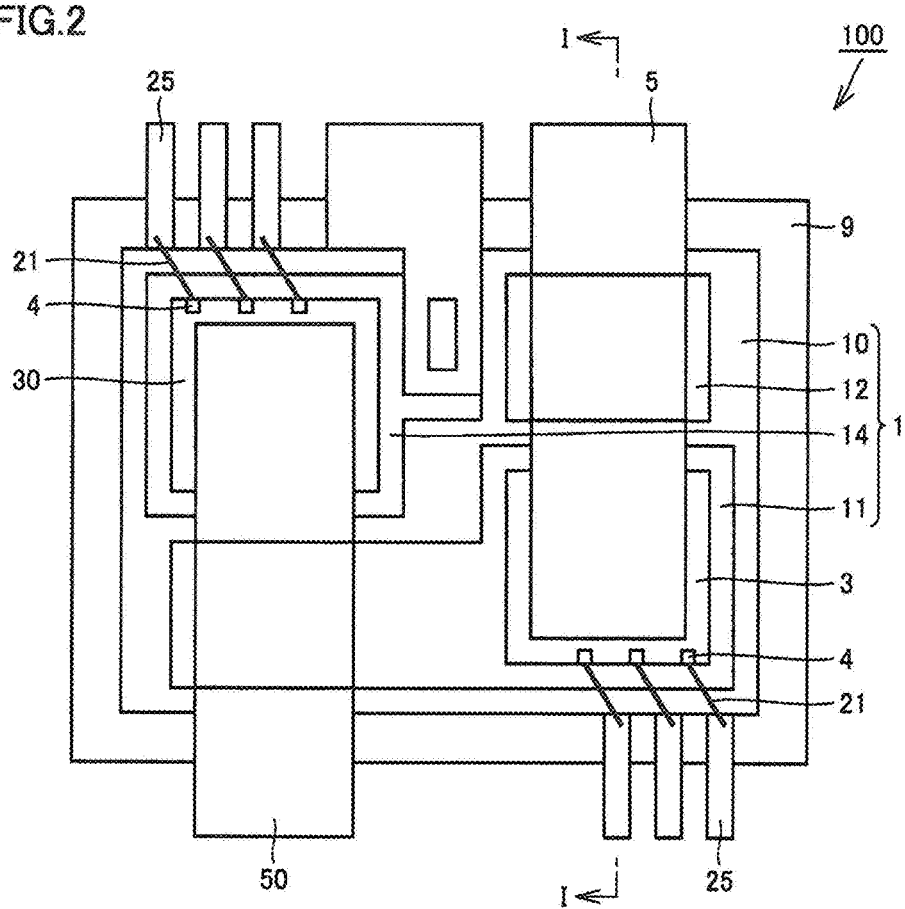
FIG. 2 is a schematic plan view illustrating the configuration of a half-bridge circuit including the featured part of the semiconductor device according to the first embodiment illustrated in FIG. 1.

With reference to FIG. 2, the cross-sectional view of the semiconductor device 100 illustrated in FIG. 1 is actually a part of the entire semiconductor device 100, and corresponds for example to that in the right half region of FIG. 2. For convenience of explanation, the resin 9 illustrated in FIG. 1 is not illustrated in FIG. 2.

As illustrated in FIG. 2, the second conductor substrate 12 has a rectangular shape in plan view. The first conductor substrate 11 extends from an adjacent region on the left side of the second conductor substrate 12 illustrated in FIG. 1, that is, an adjacent region on the lower side of the second conductor substrate 12 illustrated in FIG. 2 to an adjacent region on the left side of FIG. 2. The semiconductor element 3 connected to the upper surface of the first conductor substrate 11 in FIG. 1 is disposed on a part of the region on the first conductor substrate 11 so as to extend in a rectangular shape, without being disposed on the other region. Here, in plan view, a region of the first conductor substrate 11 on which the semiconductor element 3 is connected is defined as a first region, and the other region is defined as a second region.

The substrate unit 1 further includes a fourth conductor substrate 14 which is disposed on one main surface 10A of the insulating substrate 10 and spaced apart from the first conductor substrate 11 and the second conductor substrate 12. The fourth conductor substrate 14 is disposed in a region on the upper left side of the insulating substrate 10 in FIG. 2, and similar to the first to third conductor substrates 11 to 13, it is preferably made of copper, for example. Although not shown in the drawings, the fourth conductor substrate 14 is directly bonded to one main surface 10A by the connecting material 7 such as solder similar to that in FIG. 1, for example.

Another semiconductor element 30 is connected to a surface of the fourth conductor substrate 14 opposite to the insulating substrate 10, in other words, the upper surface thereof in FIG. 1. Although not shown in the drawings, the fourth conductor substrate 14 and the other semiconductor element 30 are directly bonded by the connecting material 7 such as solder similar to that in FIG. 1, for example. In general, similar to the semiconductor element 3, the other semiconductor element 30 is preferably made of, for example, a compound containing silicon and carbon as the primary component, and as an example of such compound, silicon carbide (SiC) may be given.

Another terminal 50 is connected to a surface of the other semiconductor element 30 opposite to the fourth conductor substrate 14, in other words, the upper surface thereof in FIG. 1. Similar to the terminal 5, the other terminal 50 extends from a region above the other semiconductor element 30 to the second region above the first conductor substrate 11, in other words, from the upper region to the lower region in FIG. 2. The other terminal 50 is connected to the second region of the first conductor substrate 11. In other words, the other terminal 50 is bonded to the upper surface of the other semiconductor element 30 by the connecting material 7, and also bonded to a region corresponding to the second region on the upper surface of the first conductor substrate 11 by the connecting material 7.

As described above, in FIG. 2, the semiconductor element 3 disposed on the first conductor substrate 11 and the second conductor substrate 12 adjacent to the first conductor substrate 11 as illustrated in the cross-sectional view in FIG. 1 are connected by the terminal 5, and on the left side thereof in FIG. 2, the other semiconductor element 30 disposed on the fourth conductor substrate 14 and the second region of the first conductor substrate 11 adjacent to the fourth conductor substrate 14 are connected by the terminal 50. Both the terminal 5 and the other terminal 50 are electrically connected to the first conductor substrate 11, and thus constitutes a half-bridge circuit.

In other words, the first conductor substrate 11 functions as a first region to which the semiconductor element 3 is connected and for connecting the terminal 5 right above the semiconductor element 3 to the other second conductor substrate 12, and also functions as a second region for receiving and connecting the other terminal 50 connected to the other semiconductor element 30 of the other fourth conductor substrate 14. In other words, the fourth conductor substrate 14 in the left half region of FIG. 2 to which the other semiconductor element 30 is connected corresponds to the first conductor substrate 11 in the right half region of FIG. 2 to which the semiconductor element 3 is connected, and the first conductor substrate 11 in the left half region of FIG. 2 corresponds to the second conductor substrate 12 in the right half region of FIG. 2 to which the semiconductor element 3 is not connected. In other words, the semiconductor element 3 is not directly connected to the second region of the first conductor substrate 11.

By enabling the first conductor substrate 11 to have two roles as described above, it is possible to reduce its footprint as compared with the case where separate members are formed to have the two roles, respectively. Further, by arranging three half-bridge circuits in parallel, it is possible to form a full bridge circuit to be housed in a single semiconductor device 100.

As illustrated in FIG. 2, the power semiconductor device mounted on the semiconductor element 3 and the other semiconductor element 30 functions as both a switch and a reflux diode, specifically, a power MOSFET and an RC-IGBT may be used as the power semiconductor device. In this way, it is possible to reduce the number of chips as compared with the case where a semiconductor element mounted with a power semiconductor device functioning as a switch and a semiconductor element mounted with a power semiconductor device functioning as a reflux diode are packaged as separate chips on the substrate unit 1. In other words, since the number of chips is reduced, it is possible to reduce the footprint to be occupied by the semiconductor elements 3 and 30 on the upper surface of the substrate unit 1. Due to the reduction of the footprint to be occupied by the semiconductor elements 3 and 30, it is possible to fill the planar layout of the semiconductor device 100 in other regions. Moreover, due to the reduction of the footprint to be occupied by the semiconductor elements 3 and 30, it is possible to shorten the distance between the semiconductor element 3 and the second conductor substrate 12 and the distance between the other semiconductor element 30 and the second region of the first conductor substrate 11 as well as shorten the length of the terminal 5 for connecting the semiconductor element 3 and the second conductor substrate 12 and the length of the other terminal 50 between the other semiconductor element 30 and the second region.

The semiconductor device 100 of the present embodiment having the above-mentioned configuration is basically formed by a manufacturing method to be described below. Hereinafter, the main steps of the manufacturing method of the semiconductor device 100 will be described.

It is preferable that the first conductor substrate 11, the second conductor substrate 12 and the third conductor substrate 13 are made of copper, and are directly bonded to one main surface 10A or the other main surface 10B by using a copper-oxygen eutectic liquid phase formed from a trace amount of oxides contained in copper. Alternatively, the first conductor substrate 11, the second conductor substrate 12 and the third conductor substrate 13 may be directly bonded to one main surface 10A or the other main surface 10B by using a brazing material to which an active metal material such as titanium and zirconium is added. Thus, the interface formed between the insulating substrate 10 and each of the first conductor substrate 11, the second conductor substrate 12 and the third conductor substrate 13 is excellent in thermal conductivity, reliability and flatness.

Hereinafter, the method of bonding the first conductor substrate 11 and the second conductor substrate 12 to one main surface 10A of the insulating substrate 10 and bonding the third conductor substrate 13 to the other main surface 10B thereof will be described in more detail. Firstly, a copper plate is bonded to one main surface 10A and the other main surface 10B, respectively. Then, the copper plate on one main surface 10A is formed with a circuit pattern by a common photolithography technique, in other words, through an exposing and developing process. By etching the circuit pattern with a chemical solution, the first conductor substrate 11 and the second conductor substrate 12 are formed on one main surface 10A. From the viewpoint of ensuring the productivity of the etching process with the chemical solution and preventing the insulating substrate 10 from warping due to the imbalance of the thickness and shape between one circuit pattern formed on one main surface 10A and the other circuit pattern formed on the other main surface 10B, it is preferable that the thickness of the copper plate is about 0.6 mm or less.

An electrode made of a thin film of aluminum on the upper surface or the lower surface of the semiconductor element 3 is formed by a well-known sputtering method, for example, in the step of manufacturing the semiconductor element 3. A metal film for performing solder bonding on the upper surface or the lower surface of the semiconductor element 3 is formed by a well-known wet plating method, a sputtering method or the like after the aluminum electrode is formed by the sputtering method mentioned above.

The semiconductor element 3 is connected to the first conductor substrate 11 by using the connecting material 7A such as solder. Specifically, after the electrode and the metal film for solder bonding are preliminarily formed on the semiconductor element 3, the connecting material 7A such as solder is placed on the first conductor substrate 11, and thereafter the semiconductor element 3 is stacked thereon. By heating the stack in a reducing atmosphere, the back surface of the semiconductor element 3 is solder boned to the first conductor substrate 11. When the semiconductor element 3 is being bonded to the first conductor substrate 11, the connecting material 7B such as solder is disposed on the upper surface of the semiconductor element 3, it is possible to form the connecting material for connecting the semiconductor element 3 to the terminal 5 in advance. As described above, by bonding the first conductor substrate 11 and the semiconductor element 3 with the connecting material 7A such as solder, it is possible to connect the first conductor substrate 11 and the semiconductor element 3 excellent in electrical and thermal conductivity while ensuring the reliability of the connection interface therebetween.

The terminal 5 is formed by punching a copper plate having a thickness of about 0.3 mm or more and 2.0 mm or less in such a manner that a partial region thereof is shaped lower than the other region (by at least the total thickness of the semiconductor element 3 and the connecting material 7B) as illustrated in FIG. 1, and then by press processing so that the partial region is controlled to be disposed lower than the other region by the necessary dimension. Thus, it is possible to arbitrarily adjust the distance between the first terminal surface of the terminal 5 and the surface of the first conductor substrate 11 and the distance between the first terminal surface of the terminal 5 and the surface of the second conductor substrate 12. It is preferable that the terminal 5 is bent in a region between, for example, the first conductor substrate 11 and the second conductor substrate 12, so that an angle between the terminal 5 inclined in the region in FIG. 1 and one main surface 10A of the insulating substrate 10 is, for example, 30° or more and 45° or less.

The terminal 5 is placed at a predetermined position on the solder serving as the connecting material 7B preliminarily disposed on the semiconductor element 3 and the solder serving as the connecting material 7C preliminarily disposed on the second conductor substrate 12. After the entire system is heated in a reducing atmosphere, the terminal 5, the semiconductor element 3 and the second conductor substrate 12 are bonded to each other.

After the terminal 5 is connected and the control electrode 4 and the external electrode 25 are electrically connected by wire bonding, the entire system is sealed by the resin 9 as illustrated in FIG. 1. This step is preferably carried out by, for example, a transfer molding method or a potting method. The transfer molding method refers to such a method that a fluid resin is injected into a mold in which the entire system is set, and then the resin is cured by heating under pressure. The potting method refers to such a method that a fluid resin is flown into a resin frame in which the entire system is set, and then the resin is cured by heating.

A bonding material such as grease is applied to the lower surface of the third conductor substrate 13 exposed from the resin 9, and a plate spring or the like is used to connect a cooler to the lower surface of the third conductor substrate 13. In other words, the third conductor substrate 13 and the cooler are fixed to each other by the pressing force of the plate spring. Thereby, the entire semiconductor device 100 as illustrated in FIG. 1 may be connected to the cooler capable of performing excellent heat conduction.

Hereinafter, the main effects of the present embodiment will be described.

Referring again to FIG. 1, if a semiconductor element is also disposed in a region above the second conductor substrate 12 in a second path, due to heat generated by the semiconductor element itself, the ability of dissipating heat transmitted from the upper side of the semiconductor element 3 of FIG. 1 to the terminal 5 by the second path is weakened as compared with the configuration according to the present embodiment in which no semiconductor element is placed in such region. In addition, the heat dissipating ability by the second path is weakened if the semiconductor element is made of a material such as silicon carbide which has a higher thermal resistance than the conductor material.

Therefore, in the present embodiment, the heat generated by the semiconductor element 3 is configured to be dissipated through a first path and a second path to be described hereinafter. The first path refers to such a path that the heat is transmitted from the semiconductor element 3 through the connecting material 7A disposed on the lower surface of the semiconductor element 3 down to the first conductor substrate 11, the insulating substrate 10 and the third conductor substrate 13, and thereafter to a cooler (not shown) disposed under the third conductor substrate 13. The second path refers to such a path that the heat is transmitted from the semiconductor element 3 through the connecting material 7B disposed on the upper surface of the semiconductor element 3 to the terminal 5, and from the terminal 5 to the second conductor substrate 12, and thereafter transmitted through the connecting material 7C, the second conductor substrate 12, the insulating substrate 10 and the third conductor substrate 13 to a cooler (not shown) disposed under the third conductor substrate 13.

In other words, the heat generated by the semiconductor element 3 is dissipated from both the upper surface and the lower surface thereof through the first path and the second path. Heat transmitted to the upper surface of the semiconductor element 3 can also be dissipated with high efficiency from the substrate unit 1 through the second path via the terminal 5 to a cooler (not shown) disposed below the substrate unit 1. Therefore, in the present embodiment, the heat dissipation efficiency may be remarkably improved as compared with the case where the heat is dissipated only from the lower surface of the semiconductor element 3 through the first path.

The heat dissipation through the second path is realized by connecting the terminal 5 to the semiconductor element 3 by the connecting material 7B and directly connecting the terminal 5 to the second conductor substrate 12 by the connecting material 7C. For that purpose, the terminal 5 is bent so that has a shorter distance to the substrate unit 1 from a part located right above the second conductor substrate 12 than from another part located right above the first conductor substrate 11 in the vertical direction in FIG. 1. With such a configuration, the heat transmitted from the upper surface of the semiconductor element 3 to the terminal 5 may be transmitted downward more quickly to the substrate unit 1.

The heat dissipation improvement achieved by dissipating heat from both the upper surface and the lower surface of the semiconductor element 3 is particularly effective in the semiconductor device 100 when it is provided with a semiconductor made of a compound such as silicon carbide, which makes it difficult to increase its chip area, and especially when it is used under higher temperature conditions.

Further, in the present embodiment, the third conductor substrate 13 corresponding to the lowermost portion of the semiconductor device 100 is exposed from the resin. When the third conductor substrate 13 is formed to be exposed from the resin 9 and cover the major part of the other main surface 10B of the insulating substrate 10, the entire base of the semiconductor device 100 may be firmly supported through the lower flat surface of the third conductor substrate 13. This is based on the fact that the third conductor substrate 13 is firmly bonded to the other main surface of the insulating substrate 10 constituting the substrate unit 1 and that the insulating substrate 10 can firmly support the substrate unit 1 and the entire base of the semiconductor device 100 including the substrate unit 1. Therefore, the application of the configuration of the substrate unit 1 and the third conductor substrate 13 according to the present embodiment make it possible to improve the degree of parallelism, in other words, the flatness of the semiconductor device 100.

Furthermore, in the present embodiment, the lowermost conductor substrate of the semiconductor device 100 is only the third conductor substrate 13. In other words, only the third conductor substrate 13 is connected to the cooler thereunder. Therefore, the degree of parallelism of the entire semiconductor device 100 including the third conductor substrate 13 is inevitably improved as compared with, for example, the case where the semiconductor device is connected to the cooler via a plurality of conductor substrates spaced apart from each other.

If the degree of parallelism of a part of the third conductor substrate 13 is poor, for example, when a cooler is attached to the lower surface of the third conductor substrate 13 with an insulating sheet sandwiched therebetween, a gap may be formed between the insulating sheet and the semiconductor device 100, making the thermal resistance therebetween increase. Moreover, when a gap is formed between the third conductor substrate 13 and the cooler, creeping discharge occurs in the gap, which makes it difficult to ensure the electrical insulation therebetween. Therefore, as described in the present embodiment, improving the flatness of the third conductor substrate 13 which is the lowest portion of the semiconductor device 100 makes it possible to improve the bonding between the third conductor substrate 13 and the cooler thereunder. Thereby, the heat dissipation from the third conductor substrate 13 to the cooler may be further improved.

The insulating substrate 10 included in the substrate unit 1 can ensure electrical insulation between the cooler connected to the lower surface of the substrate unit 1 and the semiconductor element 3 or the like. Thereby, the substrate unit 1 and the cooler may be connected to each other by using a common material such as grease or solder.

In the semiconductor device 100, the connection between the semiconductor element 3 and the first conductor substrate 11, the connection between the semiconductor element 3 and the terminal 5, and the connection between the terminal 5 and the second conductor substrate 12 are achieved by the connecting material 7 such as solder. It is preferable to use solder as the connecting material 7.

When using the connecting material 7 to connect the members included in the semiconductor device 100, a problem such as a level difference in the vertical direction (height difference) in FIG. 1 may occur due to the dimension error of each member. This level difference (height difference) or the like may be reduced to minimum by forming the semiconductor device 100 excellent in flatness by using the substrate unit 1 including the insulating substrate 10 as the base. nevertheless, a minute level difference may still remain. Therefore, in the present embodiment, it is more preferable to use, for example, a solder containing tin, copper and silver as the connecting material 7 for connecting each of the members. By using such solder, it is easy to fill in the minute level difference and thereby offset the same.

Since the thermal conductivity of the solder is about 60 W/m·K, the thermal conductivity of the grease is about 5 W/m·K, and the thermal conductivity of the insulating sheet is about 10 W/m·K, the thermal conductivity of the solder is greater than the thermal conductivity of the grease and the insulating sheet. Thus, even if a level difference is formed between the respective members and is not completely offset by the solder, since the solder has a higher thermal conductivity, it is possible to suppress the increase in the thermal resistance between the respective members so as to ensure the reliability of the semiconductor device 100.

Further, it is preferable that the terminal 5 has a larger heat capacity than the first conductor substrate 11. By reducing the thickness of the first conductor substrate 11 and the second conductor substrate 12 to 0.6 mm or less, for example, it is possible to reduce the distance in the vertical direction in FIG. 1 from the first conductor substrate 11 and the second conductor substrate 12 to the cooler, which makes it possible to lower the steady-state thermal resistance of the first conductor substrate 11. On the other hand, however, if the thickness of the first conductor substrate 11 and the second conductor substrate 12 is made too thin, their heat capacity becomes smaller, the transient thermal resistance of the first conductor substrate 11 will increase. The thickness of the terminal 5 is about 2.0 mm at the maximum, and is formed thicker than the first conductor substrate 11 and the second conductor substrate 12. Thus, the transient thermal resistance may be lowered by the terminal 5. The steady-state thermal resistance between the terminal 5 and the second conductor substrate 12 is inversely proportional to the cross-sectional area of the terminal 5. Thus, it is possible to lower the steady-state thermal resistance between the terminal 5 and the second conductor substrate 12 by forming the terminal 5 thicker, which makes it possible to promote the heat transfer from the terminal 5 to the second conductor substrate 12 in the second path.

Furthermore, in the present embodiment, the second terminal surface of the terminal 5 is covered with the resin 9 at a part right above the first conductor substrate 11 and another part right above the second conductor substrate 12, and the terminal 5 is not exposed from the uppermost surface of the resin 9. Thereby, it is possible to place a fixing tool, a control board or the like for fixing the semiconductor device 100 on the uppermost surface of the resin 9, in other words, on the uppermost surface of the semiconductor device 100.

Second Embodiment

Figure 3:
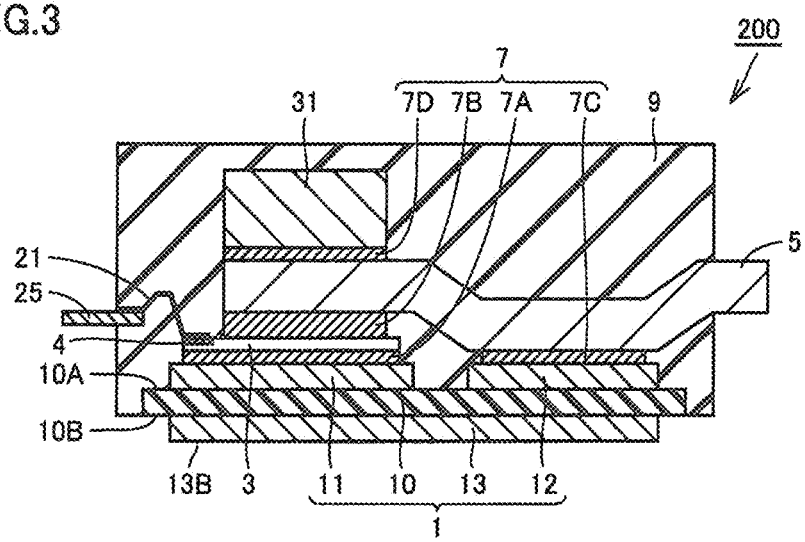
FIG. 3 is a schematic cross-sectional view illustrating the configuration of a featured part of a semiconductor device according to a second embodiment.
Figure 4:
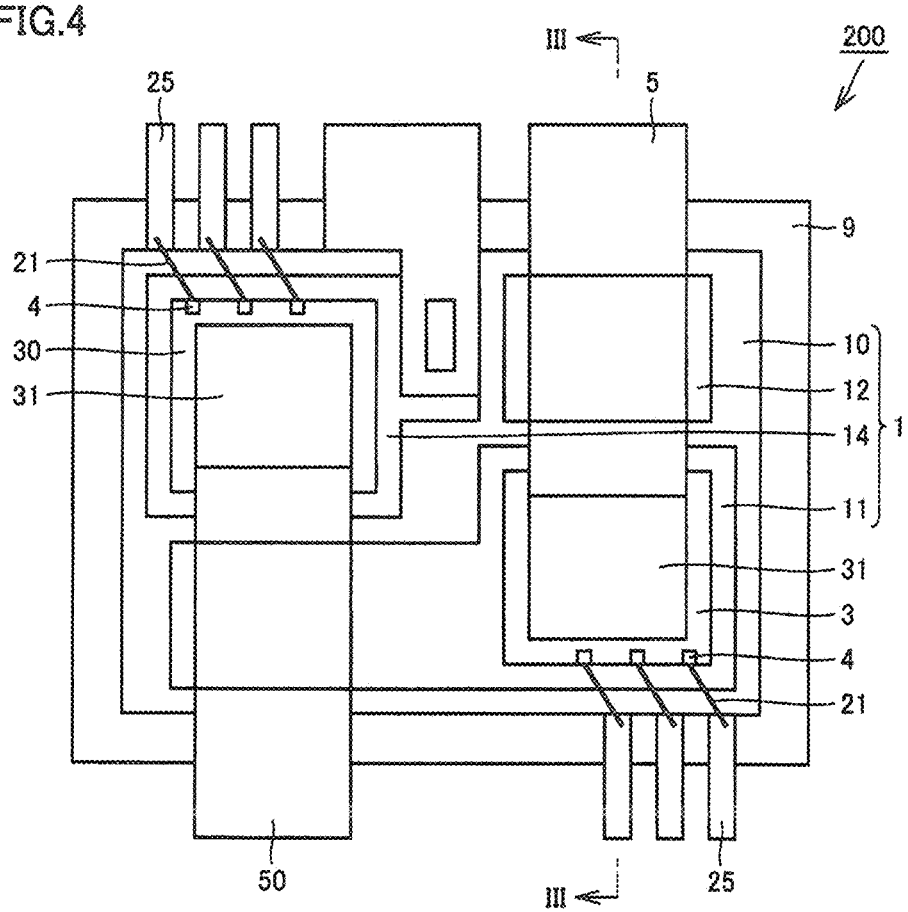
FIG. 4 is a schematic plan view illustrating the configuration of a half-bridge circuit including the featured part of the semiconductor device according to the second embodiment illustrated in FIG. 3.

FIG. 3 is a schematic sectional view taken along line III-III in FIG. 4. With reference to FIGS. 3 and 4, the semiconductor device 200 of the present embodiment has substantially the same configuration as that of the semiconductor device 100 according to the first embodiment. Thus, the same components are denoted by the same reference numerals, and the description thereof will not be repeated. In the semiconductor device 200, a first heat capacity body 31 is disposed on a surface of the terminal 5 opposite to the semiconductor element 3, in other words, the upper surface in FIG. 3 and located right above the first conductor substrate 11. The first heal capacity body 31 is connected to the upper surface of the terminal 5 by the connecting material 7D. In other words, the connecting material 7 includes the connecting materials 7A, 7B, 7C and 7D.

The first heat capacity body 31 is preferably a heat sink made of a base material such as copper and formed into a cuboid by punching a copper plate, for example. In forming the first heat capacity body 31, it is unnecessary to form a bent portion by pressing process as in the formation of the terminal 5. Thereby, it is possible to use a copper plate thicker than the copper plate for forming the terminal 5. For example, it is possible to form the first heat capacity body 31 having a thickness of 3.0 mm. The step of bonding the terminal 5 and the first heat capacity body 31 via the connecting material 7D may be performed by using solder at the same time as the step of bonding the semiconductor element 3 and the terminal 5 via the connecting material 7A, for example. At this time, it is preferable to use a jig so as to ensure the positional accuracy of the first heat capacity body 31.

The first heat capacity body 31 formed in this way has a larger heat capacity than the first conductor substrate 11 and the second conductor substrate 12.

Hereinafter, the effects of the present embodiment will be described. In addition to the effects of the first embodiment, the present embodiment further provides the following effects.

In the present embodiment, the first heat capacity body 31 which has a larger heat capacity than the first conductor substrate 11 and the second conductor substrate 12 is connected to the terminal 5. Thereby, the total heat capacity of the combination of the terminal 5 and the first heat capacity body 31 may be made greater than the heat capacity in the first embodiment. Moreover, the total transient thermal resistance of the combination of the terminal 5 and the first heat capacity body 31 may be made smaller than the transient thermal resistance in the first embodiment. As a result, it is possible to further improve the heat dissipation as compared with the first embodiment.

The first heat capacity body 31 is formed separately from the terminal 5, and is connected to the terminal 5 by the connecting material 7D. Therefore, it is possible to achieve an effect such as increasing the heat capacity of the combination of the terminal 5 and the first heat capacity body 31 without complicating the shape of the terminal 5.

Third Embodiment

Figure 5:
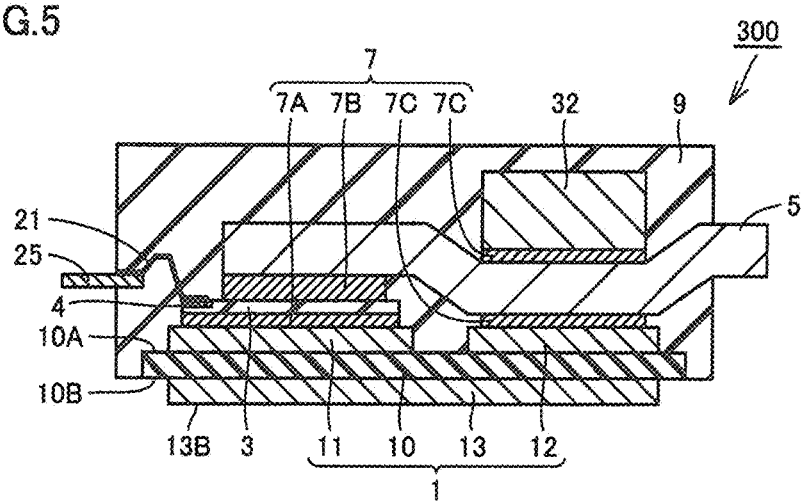
FIG. 5 is a schematic cross-sectional view illustrating the configuration of a featured part of a semiconductor device according to a third embodiment.
Figure 6:
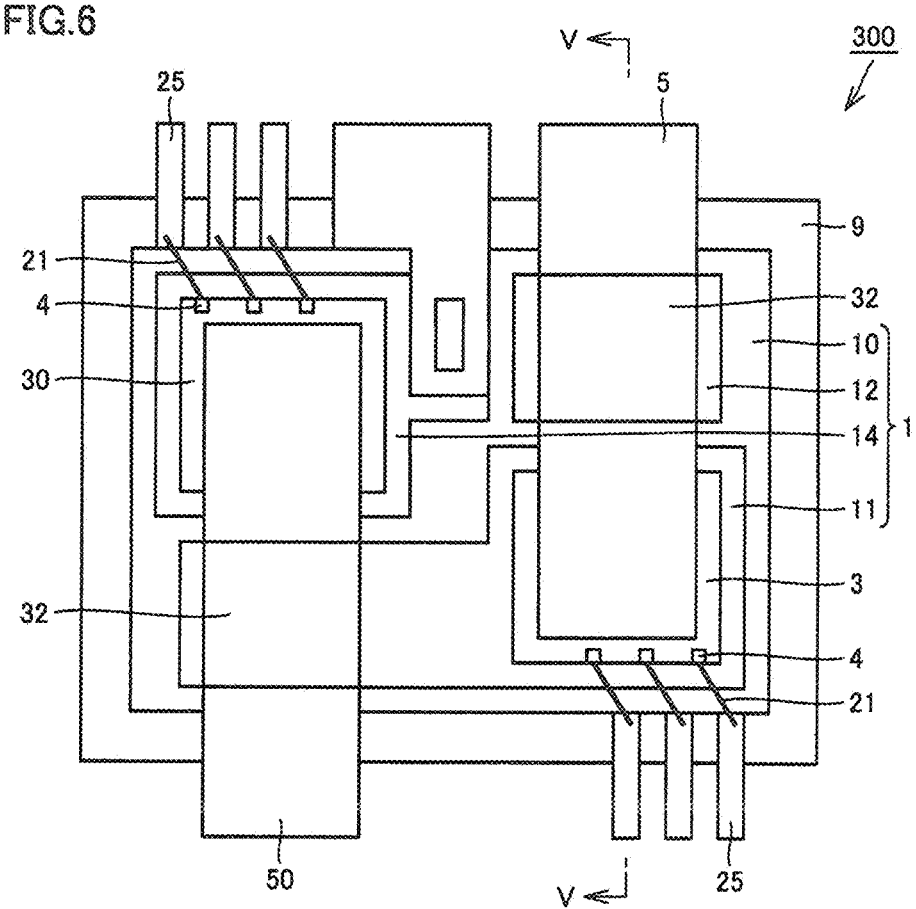
FIG. 6 is a schematic plan view illustrating the configuration of a half-bridge circuit including the featured part of the semiconductor device according to the third embodiment illustrated in FIG. 5.

FIG. 5 is a schematic sectional view taken along line V-V in FIG. 6. With reference to FIGS. 5 and 6, the semiconductor device 300 of the present embodiment has substantially the same configuration as that of the semiconductor device 100 according to the first embodiment and that of the semiconductor device 200 according to the second embodiment. Thus, the same components are denoted by the same reference numerals, and the description thereof will not be repeated. In the semiconductor device 300, a second heat capacity body 32 is disposed on a surface of the terminal 5 opposite to the substrate unit 1, in other words, the upper surface in FIG. 5 and located right above the second conductor substrate 12. The second heat capacity body 32 is connected to the upper surface of the terminal 5 by the connecting material 7D. In other words, the connecting material 7 includes the connecting materials 7A, 7B, 7C and 7D. The second heat capacity body 32 is formed from the same material into the same size by the same manufacturing method as that of the first heat capacity body 31, and thereby the detailed description thereof will not be repeated.

The second heat capacity body 32 formed in this way has a larger heat capacity than the first conductor substrate 11 and the second conductor substrate 12.

Hereinafter, the effects of the present embodiment will be described. In addition to the effects of the first and second embodiments, the present embodiment further provides the following effects.

In the present embodiment, the second heat capacity body 32 which has a larger heat capacity than the first conductor substrate 11 and the second conductor substrate 12 is connected to the terminal 5. Thereby, the total heat capacity of the combination of the terminal 5 and the second heat capacity body 32 may be made greater than the heat capacity in the first embodiment. Moreover, the total transient thermal resistance of the combination of the terminal 5 and the second heat capacity body 32 may be made smaller than the transient thermal resistance in the first embodiment. As a result, it is possible to further improve the heat dissipation as compared with the first embodiment.

(Provided that the thickness of the connecting material 7A and the connecting material 7C are equal to each other), one part of the terminal 5 located right above the second conductor substrate 12 is arranged lower than the other part thereof located right above the first conductor substrate 11 in FIG. 5 by the total thicknesses of the semiconductor element 3 and the connecting material 7B. Thus, even the thick second heat capacity body 32 is formed right above the second conductor substrate 12, as long as the total thickness of the second heat capacity body 32 and the connecting material 7D is equal to or less than the total thicknesses of the semiconductor element 3 and the connecting material 7B, the uppermost surface of the second heat capacity body 32 will never become higher than the uppermost surface of the terminal 5 arranged on the first conductor substrate 11. Therefore, as compared with the second embodiment where the first heat capacity body 31 is formed right above the first conductor substrate 11 (the semiconductor element 3), if the second heat capacity body 32 is formed right above the second conductor substrate 12 according to the present embodiment, it is possible to suppress the increase in the dimension of the entire semiconductor device 100, particularly the dimension in the vertical direction in FIG. 5. Therefore, the entire semiconductor device 100 may be made smaller than that in the second embodiment, which makes it possible to further improve the cooling performance.

Fourth Embodiment

Figure 7:
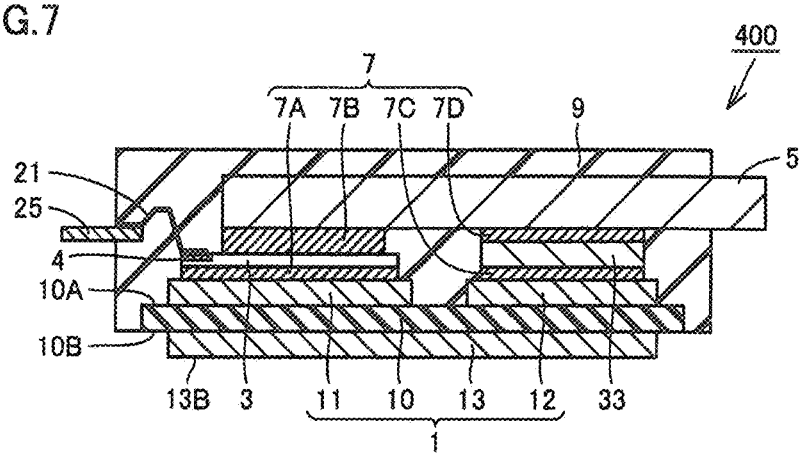
FIG. 7 is a schematic cross-sectional view illustrating the configuration of a featured part of a semiconductor device according to a fourth embodiment.
Figure 8:
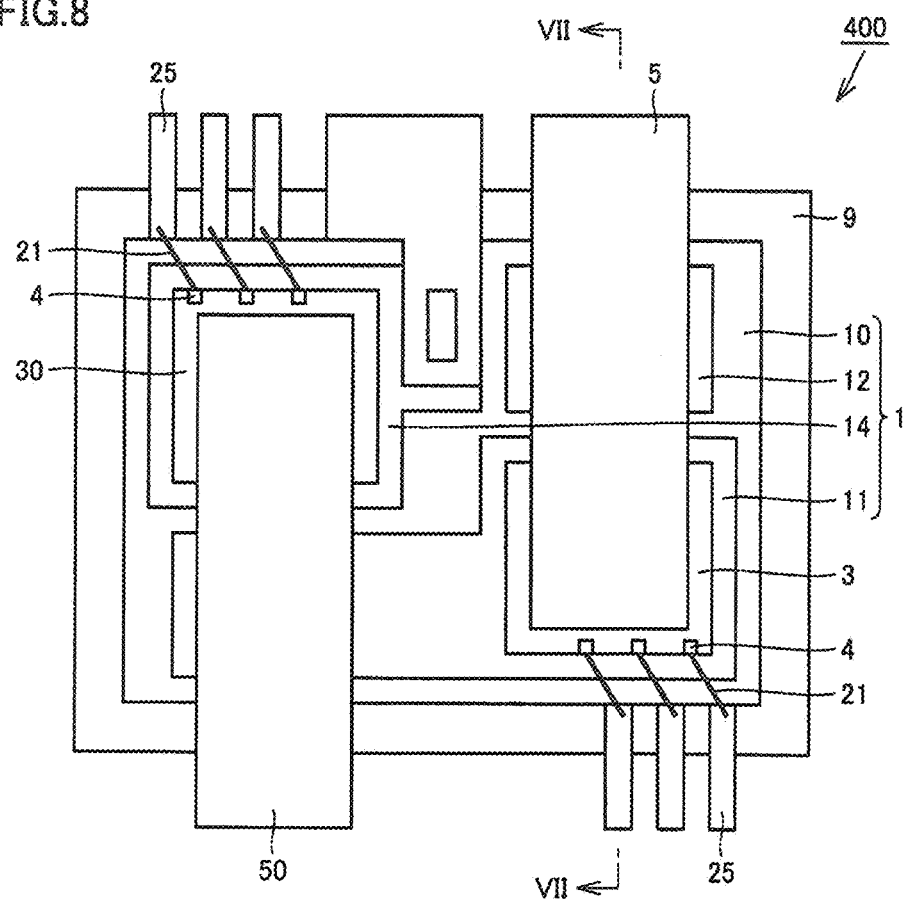
FIG. 8 is a schematic plan view illustrating the configuration of a half-bridge circuit including the featured part of the semiconductor device according to the fourth embodiment illustrated in FIG. 7.

FIG. 7 is a schematic cross-sectional view taken along line VII-VII in FIG. 8. With reference to FIGS. 7 and 8, the semiconductor device 400 of the present embodiment has substantially the same configuration as that of the semiconductor devices 100 to 300 according to the first to third embodiments, respectively. Thus, the same components are denoted by the same reference numerals, and the description thereof will not be repeated. However, the semiconductor device 400 is different from the semiconductor device 100 according to the first embodiment in that the terminal 5 is not directly connected to the second conductor substrate 12, and a member other than the connecting material 7 is disposed therebetween. Specifically, the terminal 5 is connected to the second conductor substrate 12 via a third heat capacity body 33. Similar to the first heat capacity body 31 and the second heat capacity body 32, the third heat capacity body 33 is formed into a cuboid heat sink by punching a copper plate. Therefore, the detailed description of the third heat capacity body 33 will not be repeated. The third heat capacity body 33 is connected to a surface of the second conductor substrate 12 opposite to the substrate unit 1, in other words, to the upper surface in FIG. 7 via the connecting material 7C. The upper surface of the third heat capacity body 33 in FIG. 7 is connected to the terminal 5 via the connecting material 7D. It is preferable that the third heat capacity body 33 has a larger heat capacity than the first conductor substrate 11 and the second conductor substrate 12.

In the present embodiment, particularly when the thicknesses of the first conductor substrate 11 is equal to the thickness of the second conductor substrate 12, it is preferable that the total thicknesses of the connecting material 7A, the semiconductor element 3 and the connecting material 7B is equal to the total thicknesses of the connecting material 7C, the third heat capacity body 33 and the connecting material 7D. In this case, it is unnecessary to bend the terminal 5 so that the distance from the region which is located right above the second conductor substrate 12 to the substrate unit 1 is shorter than the distance from the other region which is located right above the first conductor substrate 11 to the substrate unit 1, the terminal 5 may be flat from the region above the first conductor substrate 11 to the region above the second conductor substrate 12.

Hereinafter, the effects of the present embodiment will be described. In addition to the effects of the first to third embodiments, the present embodiment further provides the following effects.

In the present embodiment, the third heat capacity body 33 disposed between the terminal 5 and the second conductor substrate 12 may be utilized as a spacer. As a result, the total heat capacity of the combination of the terminal 5 and the third heat capacity body 33 may be made greater than the heat capacity in the first embodiment. Moreover, as compared with the first embodiment, the total cross sectional area of the combination of the terminal 5 and the third heat capacity body 33 is increased by the third heat capacity body 33, which makes it possible to reduce both the transient thermal resistance and the steady-state thermal resistance, further improving the heat dissipation by the second path.

Further, in the present embodiment, the third heat capacity body 33 is arranged right above the second conductor substrate 12 as in the third embodiment. Therefore, as compared with the second embodiment where the first heat capacity body 31 is formed right above the first conductor substrate 11 (the semiconductor element 3), in the present embodiment, if the second heat capacity body 32 is formed right above the second conductor substrate 12, it is possible to suppress the increase in the dimension 25 of the entire semiconductor device 400 in the vertical direction in FIG. 7. Therefore, the entire semiconductor device 400 may be made smaller than that in the second embodiment, which makes it possible to further improve the cooling performance.

Furthermore, in the present embodiment as described above, the terminal 5 may be made flat by adjusting the thickness of the third heat capacity body 33, which eliminates the need to perform a pressing process for forming a downward bent portion in the terminal 5 connected between the connecting material 7B and the connecting material 7D. Thereby, it is possible to reduce the processing cost of the terminal 5 and increase the upper limit of the thickness of the terminal 5. Specifically, the thickness of the terminal 5 may be set to 3.0 mm. In order to bend the copper plate by the pressing process, the copper plate is required to be thinner.

Fifth Embodiment

Figure 9:
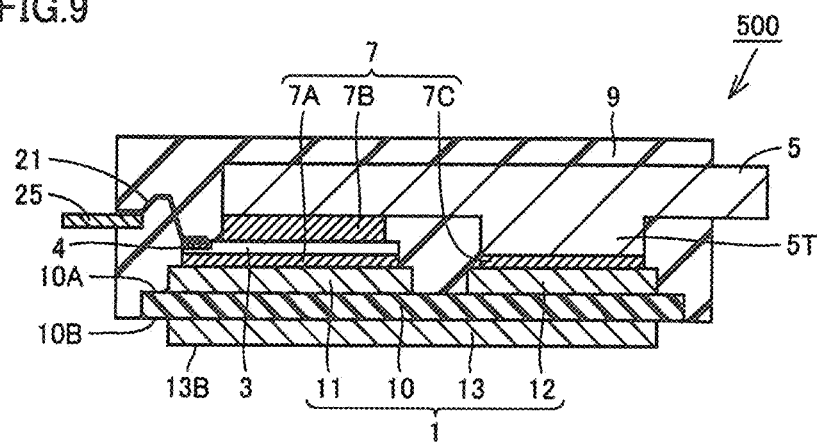
FIG. 9 is a schematic cross-sectional view illustrating the configuration of a featured part of a semiconductor device according to a fifth embodiment.
Figure 10:
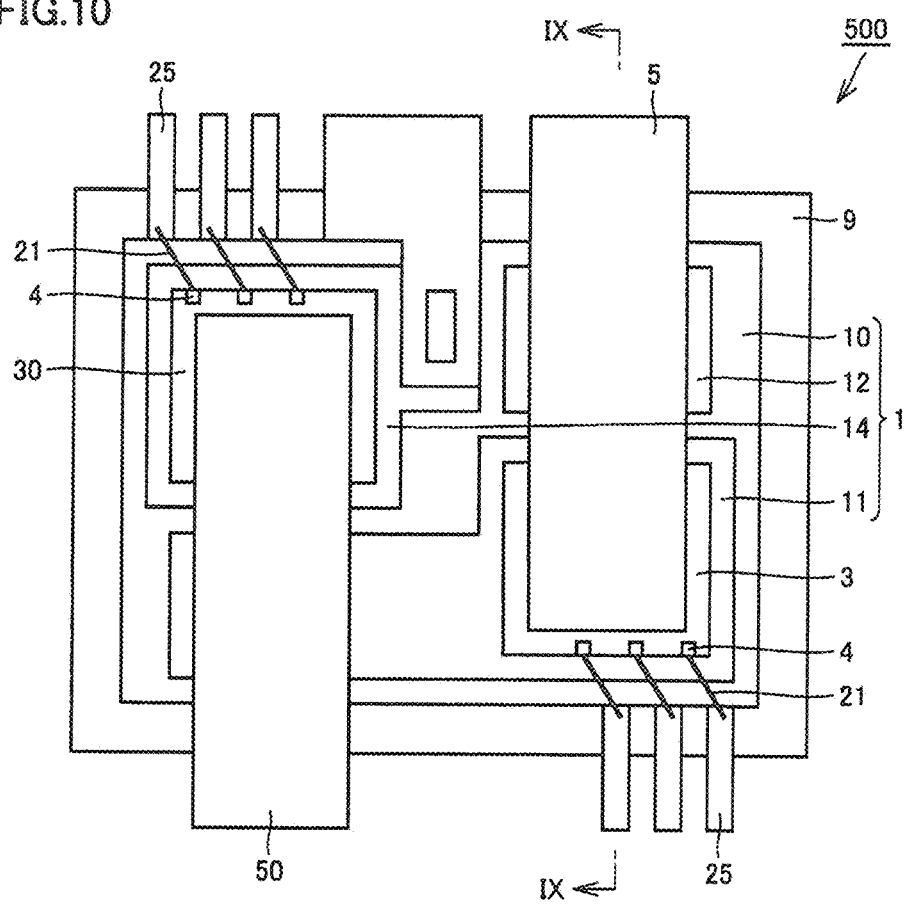
FIG. 10 is a schematic plan view illustrating the configuration of a half-bridge circuit including the featured part of the semiconductor device according to the fifth embodiment illustrated in FIG. 9.

FIG. 9 is a schematic cross-sectional view taken along line IX-IX in FIG. 10. With reference to FIGS. 9 and 10, the semiconductor device 500 of the present embodiment has substantially the same configuration as that of semiconductor device 400 according to the fourth embodiment. Thus, the same components are denoted by the same reference numerals, and the description thereof will not be repeated. However, the third heat capacity body 33 and the connecting material 7D in the semiconductor device 400 are integrated with the terminal 5 in the semiconductor device 500. Therefore, the terminal 5 is made of copper plate, and includes a portion extending flat from the region above the first conductor substrate 11 to the region above the second conductor substrate 12 similar to the terminal 5 in the semiconductor device 400, and a protruding portion 5T corresponding to the third heat capacity body 33 and the connecting material 7D in the semiconductor device 400, which are integrated together. In other words, in the terminal 5, the first terminal surface on the side of the substrate unit 1 has the protruding portion 5T protruding toward the substrate unit 1 right above the second conductor substrate 12. As a result, the first terminal surface has a shorter distance to the substrate unit 1 from a part located right above the second conductor substrate 12 than from another part located right above the first conductor substrate 11.

The thickness of the protruding portion 5T is, for example, about 1 mm, and preferably 0.7 mm or more and 1.3 mm or less.

The protruding portion 5T and the second conductor substrate 12 are connected by the connecting material 7C. Similar to the other embodiments, the terminal 5 is connected to the first conductor substrate 11 by the connecting material 7B disposed on the semiconductor element 3.

Hereinafter, the effects of the present embodiment will be described. In addition to the effects of the fourth embodiment, the present embodiment further provides the following effects.

By providing the protruding portion 5T in the present embodiment so as to integrate the connecting material 7D and the third heat capacity body 33 of the fourth embodiment with the terminal 5, it is possible to reduce the number of components and thereby facilitate processing as compared with the fourth embodiment. Further, the portion corresponding to the connecting material 7D such as solder is replaced with a part of the protruding portion 5T which is made of copper plate. The thermal conductivity of solder is about 60 W/m·K, whereas the thermal conductivity of copper is about 400 W/m·K, which is much larger than solder. Therefore, by applying the terminal 5 of the present embodiment, it is possible to further improve the heat dissipation by the second path as compared with the fourth embodiment.

In the above description, the configuration of each of the second to fifth embodiments is described as corresponding to the right half region of FIGS. 4, 6, 8 and 10, for example, it may be correspond to the right half region of FIGS. 4, 6, 8 and 10. In this case, it may be considered that the region where the other semiconductor element 30 is connected to the fourth conductor substrate 14 corresponds to the region where the semiconductor element 3 is connected to the first conductor substrate 11 in FIGS. 3, 5, 7 and 9, and the second region of the first conductor substrate 11 corresponds to the region on the second conductor substrate 12 in FIGS. 3, 5, 7 and 9.

Moreover, the features illustrated in FIGS. 1, 3, 5, 7 and 9 according to the first to fifth embodiments may be appropriately combined with the left half region and the right half region of FIGS. 2, 4, 6, 8 and 10. In other words, the technical features described above in each of the embodiments may be combined appropriately as long as they are not technically contradictory.

It should be understood that the embodiments disclosed herein have been presented for the purpose of illustration and description but not limited in all aspects. It is intended that the scope of the present invention is not limited to the description above but defined by the scope of the claims and encompasses all modifications equivalent in meaning and scope to the claims.

REFERENCE SIGNS LIST

1: substrate unit; 3: semiconductor element; 4: control electrode; 5: terminal; 5T: protruding portion; 7, 7A, 7B, 7C, 7D: connecting material; 9: resin; 10: insulating substrate; 10A: one main surface; 10B: the other main surface; 11: first conductor substrate; 12: second conductor substrate; 13: third conductor substrate; 21: wire; 25: external electrode; 30: the other semiconductor element; 31: first heat capacity body; 32: second heat capacity body; 50: the other terminal; 100, 200, 300, 400, 500: semiconductor device

The invention claimed is:

1. A semiconductor device comprising:
a substrate unit which includes an insulating substrate, a first conductor substrate and a second conductor substrate which are disposed on one main surface of the insulating substrate and spaced apart from each other, and a third conductor substrate which is disposed on the other main surface opposite to the one main surface of the insulating substrate;
a semiconductor element which is connected to a surface of the first conductor substrate opposite to the insulating substrate; and
a terminal which is connected to a surface of the semiconductor element opposite to the first conductor substrate,
the terminal extending from a region above the semiconductor element to a region above the second conductor substrate, and being connected to the second conductor substrate, and the terminal includes an end portion that is exposed from the resin,
a part of the substrate unit, the semiconductor element and the terminal being sealed by a resin, and
the third conductor substrate being exposed from the resin.

2. The semiconductor device according to claim 1, wherein
the terminal is directly connected to the second conductor substrate.

3. The semiconductor device according to claim 1, wherein
a first terminal surface of the terminal on the same side as the substrate unit has a shorter distance to the substrate unit from a part located right above the second conductor substrate than from another part located right above the first conductor substrate.

4. The semiconductor device according to claim 1, wherein
the terminal has a larger heat capacity than the first conductor substrate.

5. The semiconductor device according to claim 1, further comprising
a first heat capacity body disposed on a surface of the terminal which is located right above the first conductor substrate and opposite to the semiconductor element,
the first heat capacity body has a larger heat capacity than that of the first conductor substrate and the second conductor substrate.

6. The semiconductor device according to claim 1, further comprising
a second heat capacity body disposed on a surface of the terminal which is located right above the second conductor substrate and opposite to the substrate unit,
the second heat capacity body has a larger heat capacity than that of the first conductor substrate and the second conductor substrate.

7. The semiconductor device according to claim 1, wherein
a second terminal surface of the terminal opposite to the substrate unit is covered with the resin at least at a part right above the first conductor substrate and another part right above the second conductor substrate.

8. The semiconductor device according to claim 1, wherein
the semiconductor element is configured to function both as a switch and as a reflux diode.

9. The semiconductor device according to claim 1, wherein
the semiconductor element is made of a wide band gap semiconductor.

10. The semiconductor device according to claim 1, wherein
the semiconductor element is made of a compound containing silicon and carbon as the primary component.

11. The semiconductor device according to claim 1, wherein
the substrate unit further includes a fourth conductor substrate which is disposed on the one main surface of the insulating substrate and spaced apart from the first conductor substrate and the second conductor substrate,
the semiconductor device is further provided with another semiconductor element which is connected to a surface of the fourth conductor substrate opposite to the insulating substrate, and another terminal which is connected to a surface of the other semiconductor element opposite to the fourth conductor substrate,
the first conductor substrate includes a first region to which the semiconductor element is connected, and a second region other than the first region,
the other terminal extends from a region above the other semiconductor element to the second region of the first conductor substrate, and is connected to the second region of the first conductor substrate.

12. The semiconductor device according to claim 1, wherein
the end portion extends beyond the second conductor substrate in a direction away from the first conductor substrate.

13. The semiconductor device according to claim 1, wherein
the terminal includes a protruding portion extending toward the second conductor substrate and having a thickness greater than a thickness of a remainder of the terminal.

14. A semiconductor device comprising:
- a substrate unit which includes an insulating substrate, a first conductor substrate and a second conductor substrate which are disposed on one main surface of the insulating substrate and spaced apart from each other, and a third conductor substrate which is disposed on the other main surface opposite to the one main surface of the insulating substrate;
- a semiconductor element which is connected to a surface of the first conductor substrate opposite to the insulating substrate; and
- a terminal which is connected to a surface of the semiconductor element opposite to the first conductor substrate,
- the terminal extending from a region above the semiconductor element to a region above the second conductor substrate, and being connected to the second conductor substrate,
- a part of the substrate unit, the semiconductor element and the terminal being sealed by a resin,
- the third conductor substrate being exposed from the resin, and
- the terminal being connected to the second conductor substrate through the intermediary of a third heat capacity body.

* * * * *